(12) United States Patent
Sato et al.

(10) Patent No.: US 10,006,547 B2
(45) Date of Patent: Jun. 26, 2018

(54) PISTON RING AND ITS PRODUCTION METHOD

(71) Applicant: KABUSHIKI KAISHA RIKEN, Tokyo (JP)

(72) Inventors: Masayuki Sato, Kashiwazaki (JP); Yuuichi Murayama, Kashiwazaki (JP); Youhei Iwamoto, Kashiwazaki (JP); Takuma Sekiya, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 84 days.

(21) Appl. No.: 15/033,308

(22) PCT Filed: Oct. 27, 2014

(86) PCT No.: PCT/JP2014/078496
§ 371 (c)(1),
(2) Date: Apr. 29, 2016

(87) PCT Pub. No.: WO2015/064538
PCT Pub. Date: May 7, 2015

(65) Prior Publication Data
US 2016/0238133 A1 Aug. 18, 2016

(30) Foreign Application Priority Data
Oct. 31, 2013 (JP) ................................. 2013-226903

(51) Int. Cl.
*F16J 9/26* (2006.01)
*C23C 14/06* (2006.01)
(Continued)

(52) U.S. Cl.
CPC ............. *F16J 9/26* (2013.01); *C23C 14/0641* (2013.01); *C23C 14/0664* (2013.01);
(Continued)

(58) Field of Classification Search
USPC ........ 277/443, 440, 442, 444; 428/216, 336, 428/408, 469, 472, 698; 427/248.1, 577;
(Continued)

(56) References Cited

U.S. PATENT DOCUMENTS 6,139,022 A 10/2000 Iwashita et al.
6,821,624 B2 11/2004 Utsumi et al.
(Continued)

FOREIGN PATENT DOCUMENTS

CN 2733013 * 10/2005
JP 11-172413 A 6/1999
(Continued)

OTHER PUBLICATIONS

International Search Report issued in PCT/JP2014/078496, dated Feb. 3, 2015.
(Continued)

*Primary Examiner* — Archene Turner
(74) *Attorney, Agent, or Firm* — Birch, Stewart, Kolasch & Birch, LLP

(57) ABSTRACT

To provide a hard-amorphous-carbon-coated piston ring having low friction and excellent wear resistance and peeling resistance to reduce the fuel consumption of automobiles, an outer peripheral surface of a steel-made piston ring base material is provided with a primary layer constituted by a CrN/Cr laminate coating or a CrN/TiN laminate coating as thick as 10-60 μm, which is obtained by alternately laminating CrN-type chromium nitride and chromium metal or TiN-type titanium nitride, an intermediate layer of chromium metal and/or titanium metal as thick as 0.05-1.0 μm, and then a hard amorphous carbon coating as thick as 0.4-20 μm.

7 Claims, 3 Drawing Sheets

(51) Int. Cl.
*C23C 14/16* (2006.01)
*C23C 28/04* (2006.01)
*C23C 28/00* (2006.01)

(52) U.S. Cl.
CPC ............ *C23C 14/16* (2013.01); *C23C 28/042* (2013.01); *C23C 28/044* (2013.01); *C23C 28/322* (2013.01); *C23C 28/34* (2013.01); *C23C 28/343* (2013.01); *C23C 28/42* (2013.01)

(58) Field of Classification Search
USPC ................... 204/192.1, 192.15, 192.16, 192
See application file for complete search history.

(56) References Cited

U.S. PATENT DOCUMENTS

| | | |
|---|---|---|
| 7,955,691 B2 | 6/2011 | Moronuki et al. |
| 2001/0024737 A1 | 9/2001 | Utsumi et al. |
| 2009/0011225 A1 | 1/2009 | Moronuki et al. |
| 2010/0044968 A1 | 2/2010 | Fischer et al. |
| 2010/0210488 A1* | 8/2010 | Suzuki ................ C23C 16/0272 508/100 |
| 2011/0304101 A1* | 12/2011 | Grondahl ................ F01D 11/02 277/411 |
| 2013/0140776 A1* | 6/2013 | Kennedy ............... C23C 14/025 427/248.1 |
| 2015/0308573 A1* | 10/2015 | Sato .......................... F02F 5/00 277/443 |

FOREIGN PATENT DOCUMENTS

| | | | |
|---|---|---|---|
| JP | 11-335813 A | | 12/1999 |
| JP | 2001-316800 A | | 11/2001 |
| JP | 2002-005063 | * | 1/2002 |
| JP | 2004-169137 | * | 6/2004 |
| JP | 2005-60810 A | | 3/2005 |
| JP | 2006-250348 A | | 9/2006 |
| JP | 2007-100133 | * | 4/2007 |
| JP | 2007-169698 A | | 7/2007 |
| JP | 2007-278314 | * | 10/2007 |
| JP | 2008-25728 A | | 2/2008 |
| JP | 2010-506082 A | | 2/2010 |
| JP | 2011-173244 | * | 9/2011 |
| JP | 4839120 B2 | | 12/2011 |
| JP | 2013-91853 A | | 5/2013 |
| WO | 2011/156808 | * | 12/2011 |

OTHER PUBLICATIONS

Written Opinion of the International Searching Authority issued in PCT/JP2014/078496 (PCT/ISA/237), dated Feb. 3, 2015.

* cited by examiner

PISTON RING AND ITS PRODUCTION METHOD

FIELD OF THE INVENTION

The present invention relates to a piston ring for automobile engines, particularly to a piston ring having hard amorphous carbon [called "diamond-like carbon (DLC)"] coating having low friction, and excellent wear resistance and peeling resistance.

BACKGROUND OF THE INVENTION

Lower fuel consumption of automobiles is recently strongly required due to increased oil prices and severe environmental problems. With respect to piston rings, the reduction of ring tension, and the use of hard amorphous carbon coatings, which are expected to have low friction, etc. have been investigated. Though they actually contribute to the reduction of fuel consumption, the reduction of ring tension is reaching the limit from the aspect of sealability, and hard amorphous carbon coatings are easily peeled from the substrate because of poor adhesion due to high compression stress during the formation of coatings.

As a technology for improving the adhesion of a hard amorphous carbon coating to a substrate, various methods such as a method of relaxing the internal stress of a hard amorphous carbon coating per se, a method of forming an intermediate layer having medium properties between a substrate and a hard amorphous carbon coating, etc., have been proposed.

JP 11-172413 A discloses a method for relaxing internal stress in a hard amorphous carbon coating per se, by dispersing carbides of one or more elements selected from the group consisting of Si, Ti, W, Cr, Mo, Nb and V in the coating. This coating has not only improved adhesion due to the relaxed internal stress, but also excellent initial conformability because of relative softness, which is unexpected feature as a hard amorphous carbon coating.

Conventional intermediate layers are as thick as 50 nm or more, and when an amorphous carbon coating is formed on such a thick intermediate layer, sufficient adhesion is not obtained to machine parts, etc. used under extremely high contact pressure. In view of this problem, JP 2001-316800 A discloses an intermediate layer made of at least one selected from the group consisting of elements in Groups IVa, Va, Via and IIIb, and Group IVb (excluding C), or carbide thereof, and having thickness of 0.5 nm or more and less than 10 nm for remarkably high adhesion.

JP 2006-250348 A discloses an intermediate layer having excellent adhesion to both of a substrate and a DLC coating, which comprises a metal capable of reducing oxides on the substrate surface (for example, a metal such as Si, Ti, Cr, etc., whose oxide has a standard formation free energy of −600 kJ or less at 100° C.), thereby having an oxygen concentration increasing from the surface side to the inside; a layer of carbide or amorphous carbon having high affinity to the DLC coating being formed on the intermediate layer, such that the concentration of carbon decreases from the surface side to the inside.

JP 2007-169698 A discloses the formation of a low-density, hard amorphous carbon coating as an intermediate layer between a substrate and a high-density coating having a high $sp^3$ bond (diamond bond) ratio, in place of an intermediate layer of metal, etc. This low-density, hard amorphous carbon coating looking bright in a transmission electron photomicrograph decreases residual stress and relaxes internal stress, thereby improving adhesion. It also describes that continuously changing density is more preferable.

JP 2008-25728 A discloses the formation of a primary layer made of at least one of Cr, W, Ti and Si, and an intermediate layer made of the above metal and carbon, a ratio of carbon increasing from the primary layer side to the surface side, under a hard amorphous carbon coating, instead of forming only an intermediate layer.

As a multi-layer intermediate layer, JP 2013-91853 A discloses an intermediate layer having a laminate structure comprising a first Cr layer, a CrN layer and a second Cr layer in this order from the base material (substrate) side.

However, the above intermediate layers are still insufficient, failing to overcome such problems as cracking, chipping and peeling of hard amorphous carbon coatings.

OBJECT OF THE INVENTION

An object of the present invention is to provide a piston ring having a hard amorphous carbon coating having low friction for lower fuel consumption of automobiles, as well as excellent wear resistance and peeling resistance, and its production method.

DISCLOSURE OF THE INVENTION

With respect to a piston ring having a hard amorphous carbon coating effective for reducing friction, the inventors have conducted intensive research, paying attention to the properties such as Young's modulus, thermal conductivity, etc. of intermediate layers and primary layers, etc., to improve the adhesion of the hard amorphous carbon coating having high Young's modulus. As a result, it has been found that the formation of a primary layer constituted by a relatively thick, hard laminate coating having excellent thermal conductivity, and an intermediate layer having good adhesion to the hard amorphous carbon coating, with an interface of the primary layer with the intermediate layer containing the same metal or nitride thereof as those of the intermediate layer, can improve the wear resistance and peeling resistance of the coating.

The inventors have also found that a primary layer constituted by a laminate coating can have improved hardness and thermal conductivity, by controlling the thickness of each layer close to the crystallite size of each crystal, thereby suppressing the propagation of cracks.

Thus, the piston ring of the present invention has a hard amorphous carbon coating having a thickness of 0.4-20 µm at least on its outer peripheral sliding surface;
the base material of the piston ring being steel;
a primary layer and an intermediate layer being interposed between the base material and the hard amorphous carbon coating;
the primary layer comprising a CrN/Cr or CrN/TiN laminate coating as thick as 10-60 µm, which is an alternate laminate of CrN-type chromium nitride and chromium metal or TiN-type titanium nitride; and
the intermediate layer comprising chromium metal and/or titanium metal as thick as 0.05-1.0 µm.

With respect to the laminate coating constituting the primary layer, a CrN/Cr laminate unit composed of a CrN layer and a Cr layer in the CrN/Cr laminate coating is preferably as thick as 30-120 nm, in a range of 1-3 times the sum of the crystallite size of the chromium nitride and the crystallite size of the chromium metal, and a CrN/TiN laminate unit composed of a CrN layer and a TiN layer in the CrN/TiN laminate coating is preferably as thick as 20-100 nm, in a range of 1-3 times the sum of the crystallite size of the chromium nitride and the crystallite size of the titanium nitride.

Carbon (C) is preferably dissolved in the CrN-type chromium nitride.

An interface of the primary layer with the intermediate layer preferably has a composite structure comprising chromium nitride and chromium metal, or a composite structure comprising chromium nitride and titanium nitride. The composite structure preferably has a contour-like pattern.

In the piston ring of the present invention, the hard amorphous carbon coating preferably has a hydrogen content of 5 atomic % or less.

The method of the present invention for producing a piston ring having a hard amorphous carbon coating having a thickness of 0.4-20 µm at least on its outer peripheral sliding surface comprises the steps of adjusting the surface roughness $Rz_{JIS}$ of a base material of the steel-made piston ring to 0.05-3 µm;

alternately laminating CrN-type chromium nitride and chromium metal or TiN-type titanium nitride to form a CrN/Cr or CrN/TiN laminate coating as thick as 15-70 µm;

grinding the CrN/Cr or CrN/TiN laminate coating; and then forming an intermediate metal layer and the hard amorphous carbon coating thereon.

DESCRIPTION OF THE PREFERRED EMBODIMENTS

Figure 1:
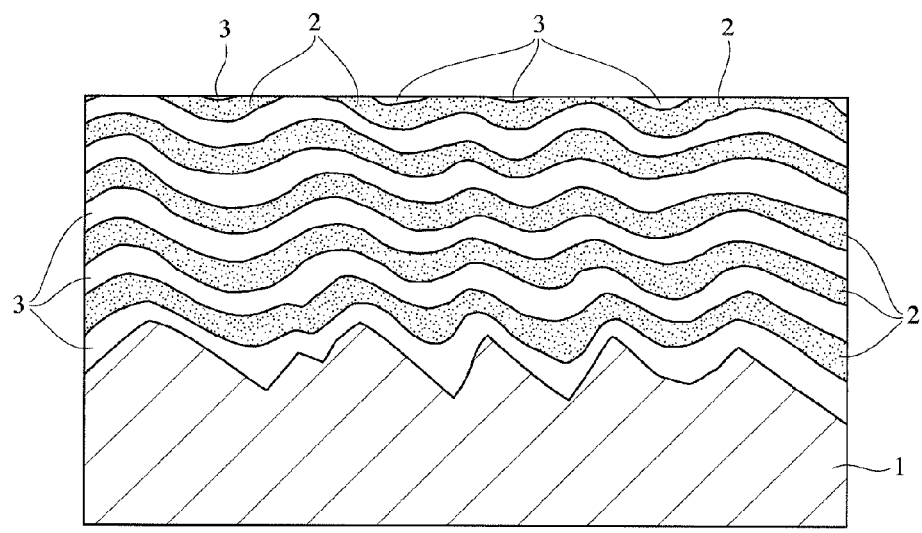
FIG. 1 is a view schematically showing a cross section of the primary layer of the present invention.

The piston ring of the present invention has a hard amorphous carbon coating having a thickness of 0.4-20 µm at least on its outer peripheral sliding surface; the base material of the piston ring being steel; a primary layer and an intermediate layer being interposed between the base material and the hard amorphous carbon coating; the primary layer comprising a CrN/Cr or CrN/TiN laminate coating as thick as 10-60 µm, which is an alternate laminate of CrN-type chromium nitride and chromium metal or TiN-type titanium nitride; and the intermediate layer comprising chromium metal and/or titanium metal as thick as 0.05-1.0 µm. Namely, it is characterized by the primary layer and the intermediate layer formed between the steel-made piston ring base material and the hard amorphous carbon coating as a structure for providing excellent adhesion therebetween, and its formation method.

[1] Primary Layer

It is reported by A. C. Ferrari et al. (Mat. Res. Soc. Symp. Proc., Vol. 593, pp. 311-316, 2000) that a hard amorphous carbon coating formed by arc ion plating, which may be called "AIP" below, has a Young's modulus of 757.5 GPa, about 3.6 times the Young's modulus (about 210 GPa) of steel. Accordingly, a hard amorphous carbon coating formed on steel directly or via a thin intermediate layer peels from steel, because it cannot follow the deformation of steel, when high stress is generated locally during the sliding of a piston ring. In the present invention, an alternate laminate coating of CrN-type chromium nitride and chromium metal or TiN-type titanium nitride, namely, a CrN/Cr laminate coating or a CrN/TiN laminate coating, is formed as a primary layer by AIP. According to Ichimura, et al. (Surface Technology, Vol. 52, No. 1, pp. 110-115, 2001), CrN and TiN have Young's module of 430 GPa and 550 GPa, respectively, almost middle of those of steel and the hard amorphous carbon coating. With a high-hardness primary layer as thick as 10-60 µm formed by CrN and TiN having middle Young's moduli, the deformation of the base material (steel) can be suppressed, avoiding the peeling of the hard amorphous carbon coating. Of course, a hard amorphous carbon coating containing hydrogen or a metal is satisfactory as the primary layer, because it has a Young's modulus equal to or lower than those of CrN and TiN.

Though these nitrides formed by AIP have higher internal stress as they get thicker, their internal stress can be relaxed by lamination. Chromium metal layers in the CrN/Cr laminate coating act as stress-relaxing layers absorbing strain. The primary layer as thin as less than 10 µm would not have sufficient effect of suppressing the deformation of the base material, while the primary layer as thick as more than 60 µm would use increased amounts of raw materials and suffers lower productivity, resulting in undesirable cost increase. The thickness of the primary layer is preferably 15-35 µm.

Though the hard amorphous carbon coating has high hardness and Young's modulus, it does not exhibit high thermal conductivity because of phonon scattering due to its amorphous structure. According to J. Robertson (Mater. Sci. Eng., R 37, pp. 129-281, 2002), a hard amorphous carbon coating having a high $sp^3$ bonding ratio has thermal conductivity of about 6-10 W/(m·K). Accordingly, with the intermediate layer and the primary layer having higher thermal conductivity, the thermal stress of the entire coating can be reduced, thereby preventing cracking and chipping. According to Oki (Surface Technology, Vol. 41, No. 5, pp. 462-470, 1990), the thermal conductivities of CrN and TiN formed by AIP are 0.0261-0.0307 cal/cm·sec·deg [10.9-12.9 W/(m·K) as an SI unit] and 0.07 cal/cm·sec·deg [29.3 W/(m·K) as an SI unit], respectively, higher than that of the hard amorphous carbon coating. "Physics And Chemistry Encyclopedia of Japan" describes that Cr metal has thermal conductivity of 90.3 W/(m·K) at room temperature. Thus, the primary layer constituted by a CrN/Cr laminate coating or a CrN/TiN laminate coating improves the thermal conductivity of the entire coating including the hard amorphous carbon coating.

CrN-type chromium nitride is chromium nitride mainly composed of CrN, though it may contain $Cr_2N$. TiN-type titanium nitride is titanium nitride mainly composed of TiN, though it may contain $Ti_2N$. To obtain high hardness and wear resistance, CrN is preferably CrCN in which carbon (C) is dissolved in CrN, though its thermal conductivity is slightly sacrificed. With part of N substituted by part of C at lattice positions, the ion radii of both Cr and N are changed to locally increase stress in the lattice of CrCN, thereby increasing the hardness of CrCN. It is also said that internal energy stored during crystal growth is reduced while keeping high hardness, so that residual stress is suppressed macroscopically, providing CrCN with high fracture toughness. To obtain such properties, the CrCN layer preferably has a carbon concentration of 2-8% by mass.

When the primary layer is constituted by a CrN/Cr laminate coating, the thickness of a laminate unit in the laminate coating is preferably 30-120 nm, more preferably 30-80 nm, from the aspect of the propagation of cracks. In the case of a CrN/TiN laminate coating, it is preferably 20-100 nm, more preferably 20-80 nm. In a laminate coating of different layers, in general, cracks are easily propagated along their interfaces because of strain remaining therein. In the CrN/Cr laminate coating, however, strain is absorbed by Cr metal layers. Also, in the CrN/TiN laminate coating, highly aligned, strong interfaces are formed, because CrN and TiN have extremely close lattice constants. When the laminate coating has a laminate unit whose thickness is close to the sum of the crystallite sizes of crystals (CrN and Cr, or CrN and TiN) constituting the laminate coating, it may be regarded as a single crystal at least in a thickness direction, with remarkably improved rigidity as compared with that of polycrystals. It is considered that such laminate coating has a polycrystalline structure having small-angle tilt boundaries in parallel to the coating surface, which suppresses the propagation of cracks in both interfaces and inside the laminate coating. The thickness of a laminate unit in each laminate coating is preferably in a range of 1-3 times the sum of the crystallite sizes of crystals constituting the laminate coating.

When the CrN layer, the Cr layer and the TiN layer, particularly the CrN layer and the TiN layer, have thicknesses closer to the crystallite sizes of CrN, Cr and TiN, respectively, phonon scattering due to grain boundaries is reduced, resulting in improved thermal conductivity. Accordingly, the thickness of a laminate unit in each laminate coating is preferably in a range of 1-3 times, more preferably in a range of 1-2 times, further preferably in a range of 1-1.5 times the sum of the crystallite sizes, from the aspect of both strength and thermal conductivity. Though the CrCN layer had decreased thermal conductivity by a solid solution with C, such decrease in the thermal conductivity is offset by making the thickness of one layer close to the crystallite size.

Because Cr metal has thermal conductivity of 90.3 W/(m·K), about 8 times the thermal conductivity [10.9-12.9 W/(m·K)] of CrN, and because TiN has thermal conductivity of 29.3 W/(m·K), about 2.5 times that of CrN, the lamination of Cr metal and TiN increases the thermal conductivity of the entire coating. On the other hand, Cr metal is poorer than CrN in hardness and wear resistance, and TiN is poorer than CrN in corrosion resistance. Accordingly, the ratios of Cr metal and TiN are preferably increased for thermal conductivity, and the ratio of CrN is preferably increased for hardness, wear resistance and corrosion resistance. For their good balance, the thickness (volume) ratio of the CrN layers to the Cr layers is preferably 9/1 to 5/5, and the atomic ratio of Cr/Ti is preferably in a range of 3/7 to 7/3.

The growth orientations of the laminated CrN layers, Cr layers and TiN layers differ depending on the deposition conditions. Though not particularly restrictive, the CrN layer and the TiN layer preferably have the maximum diffraction intensities in their (200) planes, and the Cr layer preferably has the maximum diffraction intensity in its (110) plane.

A metal layer for improved adhesion may be formed between the primary layer and the base material.

[2] Intermediate Layer

In the present invention, the intermediate layer is interposed between the hard amorphous carbon coating and the primary layer. The intermediate layer as thick as 0.05-1.0 μm is made of chromium metal and/or titanium metal. Chromium metal and titanium metal are likely bonded to carbon (C) to form carbides, thereby exhibiting excellent adhesion to the hard amorphous carbon coating because of high affinity. In the formation of the hard amorphous carbon coating, better adhesion is obtained if a mixed layer of Cr and/or Ti and C is formed by carbon bombardment. When the intermediate layer is thinner than 0.05 μm, sufficient adhesion would not be obtained if fine pores were formed in small-angle tilt boundaries of the primary layer. On the other hand, the intermediate layer thicker than 1.0 μm is undesirable from the aspect of supporting the hard amorphous carbon coating by a high-hardness primary layer.

[3] Microstructure of Interface Between Primary Layer and Intermediate Layer

Figure 2:
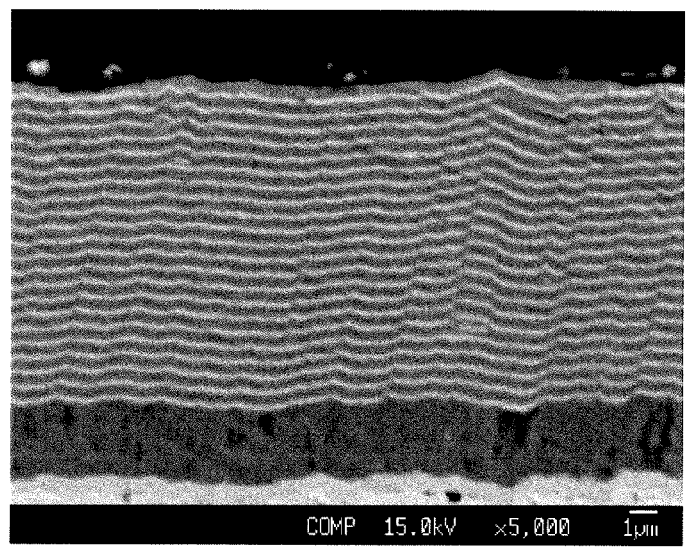
FIG. 2 is a scanning electron photomicrograph showing a cross section of the primary layer of the present invention formed by a CrN/Cr laminate coating.

In the present invention, the interface of the primary layer with the intermediate layer of chromium metal is preferably a CrN/Cr laminate coating having a composite structure of CrN and Cr, or a CrN/TiN laminate coating having a composite structure of CrN and TiN. From the aspect of adhesion, the Cr layer in the CrN/Cr laminate coating is desirably the same as chromium metal of the intermediate layer in terms of material, and CrN is also desirable because it contains Cr. Accordingly, the CrN/TiN composite structure has excellent adhesion to the intermediate layer of chromium metal. Of course, the CrN/TiN composite structure has excellent adhesion to the intermediate layer of titanium metal. Even if the CrN/Cr laminate coating or the CrN/TiN laminate coating is formed on a completely flat base material, a composite structure of CrN and Cr or CrN and TiN is exposed on the outermost surface by grinding the outer peripheral sliding surface with an angle to the base material surface. For example, when a laminate coating of CrN 2 and Cr 3 or CrN 2 and TiN 3 is formed on a roughened base material 1 as shown in FIG. 1, a wave-like laminate coating is formed. Thus, by grinding the outer peripheral sliding surface flat, a composite structure of CrN 2 and Cr 3 or CrN 2 and TiN 3 appears on the outermost surface. In general, a laminate coating of CrN 2 and Cr 3 or CrN 2 and TiN 3 is more preferably formed on a roughened base material. FIG. 2 is a scanning electron photomicrograph showing a CrN/Cr laminate coating formed on a roughened base material (for easy observation of the structure, each layer is thick, and relatively thick Cr layer and CrN layer are formed between the base material and the laminate coating). It is clear from FIG. 2 that a rough shape of the base material was transferred to the formed laminate coating.

Figure 3:
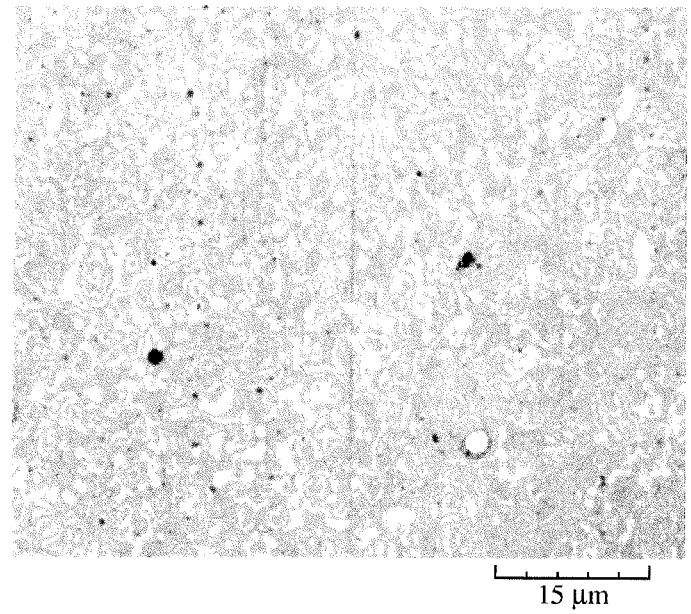
FIG. 3 is a laser photomicrograph showing the microstructure of the outermost surface of the primary layer of the present invention formed by a CrCN/Cr laminate coating.

CrN, Cr and TiN in the primary layer appearing in the interface with the intermediate layer preferably constitutes a contour-like pattern, depending on the thickness of a laminate unit in the laminate coating, an angle of the laminate surface to the ground surface, the wavelength of a wave-like laminate coating, etc. Under good conditions, the contour-like pattern has a laminar ring pattern. FIG. 3 is a laser photomicrograph of the mirror-polished outermost surface of a primary layer before an intermediate layer of a CrCN/Cr laminate coating is formed, showing a CrCN/Cr composite structure comprising white Cr dispersed in a gray CrCN matrix. Paying attention to Cr, for example, it is dispersed in a laminar or contour-like pattern. Taking the lamination intervals of the laminate coating into consideration, the width of the Cr or CrN phase is preferably 1 μm or less, more preferably 0.4 μm or less, on average.

[4] Hard Amorphous Carbon Coating

The hard amorphous carbon coating is produced by a plasma CVD method using a hydrocarbon gas as a starting material, or by sputtering or AIP using graphite as an evaporation source. In the case of a piston ring, which method should be used is determined by a material of a sliding mate member, etc. For example, a hard amorphous carbon coating containing hydrogen and a metal such as tungsten, etc. is formed on a sliding mate member of the aluminum bore, and a hydrogen-free, hard amorphous carbon coating is formed on a sliding mate member of the cast iron bore. Though not particularly restrictive, AIP is used to form the hard amorphous carbon coating of the present invention, preferably a hard amorphous carbon coating containing substantially no hydrogen and having a high $sp^3$ bonding ratio. The hydrogen content in the hard amorphous carbon coating is preferably 5 atomic % or less, more preferably 1 atomic % or less. Because a hard amorphous carbon coating having a small hydrogen content is extremely hard, resistant to wearing, it can keep a special outer peripheral shape of a piston ring for a long period of time, thereby suppressing friction increase, while drastically reducing friction by adsorbing an oily agent in a lubricating oil because of no hydrogen content.

The thickness of the hard amorphous carbon coating is preferably 1-10 μm when it contains hydrogen, and 1-20 μm when it contains a metal. In the case of the hydrogen-free, hard amorphous carbon coating, its thickness is preferably 0.5-1.5 μm, more preferably 0.6-1.0 μm. Also, to reduce friction, the surface roughness Ra is preferably 0.01-0.1 μm, more preferably 0.01-0.07 μm.

[5] Production Method (1) Adjustment of Surface Roughness of Base Material

In order that the piston ring of the present invention has a primary layer having a wave-like laminate cross section, an outer peripheral sliding surface of a steel substrate (base material) is provided with surface roughness $Rz_{JIS}$ (ten-point average surface roughness, JIS B0601 2001) adjusted to 0.05-3 μm, before the primary layer is formed. When $Rz_{JIS}$ is less than 0.05 μm, the laminate coating comprises substantially parallel layers, with a rough (or coarsened) composite structure of CrN and Cr or CrN and TiN, resulting in uneven adhesion to the intermediate layer. When $Rz_{JIS}$ exceeds 3 μm, too large roughness is undesirably provided to the coating, so that the coating easily has defects. $Rz_{JIS}$ is preferably 0.1-2 μm, more preferably 0.2-1.5 μm.

(2) Formation of Primary Layer

Figure 4:
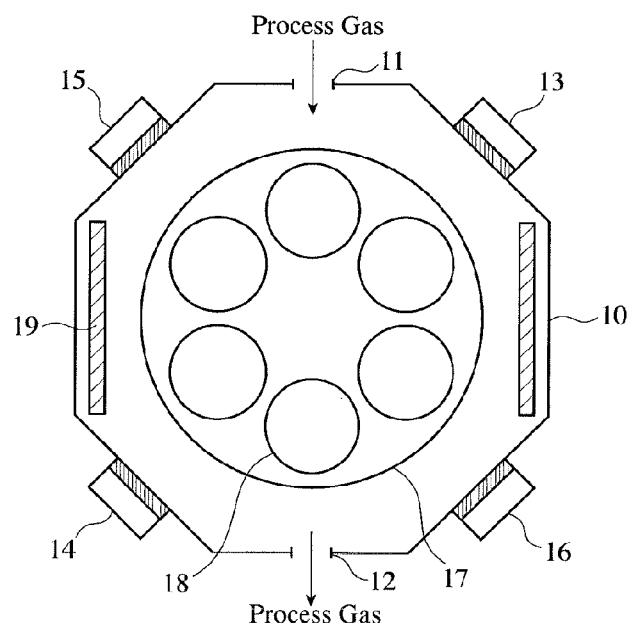
FIG. 4 is a schematic view showing an arc ion plating apparatus used in the present invention.

In the present invention, the CrN/Cr laminate coating is formed as the primary layer, using an AIP apparatus shown in the schematic plan view of FIG. 4. In this AIP apparatus, works 18 (stacked piston rings) are set in a vacuum chamber 10 having a gas inlet 11 and a gas outlet 12, with Cr metal cathodes (targets) 13, 14 of evaporation sources opposing via a rotating table 17. In this case, the evaporation sources 15, 16 are not operated. The works 18 per se are also rotated on the rotating table 17. Each evaporation source 13, 14 is connected to an anode (not shown) of an arc power supply, and the rotating table 17 is connected to a bias power supply (not shown). Heaters 19 are attached to an apparatus wall.

An arc ion plating method for forming the CrN layer comprises introducing a process gas [nitrogen ($N_2$)] into the vacuum chamber 10; generating arc on the Cr metal cathodes 13, 14 of the evaporation sources to melt the Cr metal instantaneously, so that it is ionized in nitrogen plasma; and causing the reaction of chromium ions with nitrogen plasma to form CrN, which is attracted to a surface of each work 18 to which negative bias voltage is applied, thereby forming a CrN layer. When the Cr layer is formed, the supply of a nitrogen gas ($N_2$) is stopped. During the above period, an inert gas such as an argon (Ar) gas may be introduced. When the CrCN layer is formed, a nitrogen ($N_2$) gas and a hydrocarbon (for example, $CH_4$) gas are preferably used as a process gas, with an argon (Ar) gas added. Because the composition of chromium nitride is determined by the amount of Cr metal evaporated from the Cr metal cathode and the partial pressure of a nitrogen gas, arc current at the evaporation source and the partial pressure of a nitrogen gas are preferably controlled to make CrN-type chromium nitride a main component, with the process gas switched while keeping arc discharge on the Cr metal cathode.

The thickness of each CrN layer (or CrCN layer) and each Cr layer can be controlled by arc current and the start/stop timing of supplying a process gas. The thickness of each layer can be measured by direct observation with a field emission-scanning electron microscope (FE-SEM), etc. The thickness of a laminate unit composed of a CrN layer (or CrCN layer) and a Cr layer is a value determined by dividing the thickness of the coating by the repeating number of introducing and stopping a process gas, or a value determined by multiplying the deposition rate (μm/min) by the time period of depositing a CrN layer (or CrCN layer) and a Cr layer [cycle time (min) of introducing and stopping a process gas]. Because a higher deposition rate is achieved by higher arc current, the thickness of a laminate unit becomes smaller by lowering arc current or by reducing the time period of introducing and stopping a process gas.

When the primary layer is constituted by a CrN/TiN laminate coating, one of evaporation sources (for example, 14 in FIG. 4) is changed to a Ti metal cathode (target), such that the Cr metal cathode 13 and the Ti metal cathode 14 are opposite to each other via the rotating table 17, to carry out ion plating with a nitrogen ($N_2$) gas as a process gas. The formation of the CrN/TiN laminate coating may be carried out by alternately forming CrN and TiN by alternately conducting discharge at the Cr metal cathode and discharge at the Ti metal cathode. To increase the deposition rate for higher productivity, discharge is preferably conducted simultaneously at the Cr metal cathode and the Ti metal cathode.

The compositions of chromium nitride and titanium nitride are adjusted by controlling arc current at each evaporation source and the partial pressure of a nitrogen gas, such that their main components are CrN and TiN. Because the amount of a metal evaporated from the evaporation source depends on the vaporization pressure of the metal at its own melting point and arc current (temperature), the arc current may be changed within a range of not changing the composition (for example, not changing a CrN-based composition to a $Cr_2N$-based composition), to change a ratio of Cr to Ti. Accordingly, the thickness of each CrN layer and each TiN layer can be controlled by the arc current and the rotating speed of the table 17. The thickness of a laminate unit formed during one rotation of the table is a value obtained by dividing the deposition rate (μm/min) by the rotation speed (rpm) of the table. Of course, it may be measured by direct observation with a field emission-scanning electron microscope (FE-SEM), etc. Because higher arc current provides a higher deposition rate, the thickness of each layer gets smaller by decreasing the arc current or increasing the rotation speed of the table.

The crystal structure of a coating formed by arc ion plating can generally be controlled by furnace pressure and bias voltage. It is said that higher furnace pressure and lower bias voltage provide columnar crystals, while lower furnace pressure and higher bias voltage provide granular crystals. However, it may not be necessarily true, because there is also a teaching that higher bias voltage provides columnar crystals. A film-forming environment in ion plating is extremely complicated; for example, if an apparatus were changed, the same crystal structure would not necessarily be obtained by the same arc current, furnace pressure and bias voltage. Of course, not only the base material, the crystal structure, the temperature and the surface condition, but also the furnace structure (arrangement of a work relative to the evaporation source, etc.) exert relatively large influence. Accordingly, the deposition conditions should be determined for every apparatus.

(3) Grinding of Primary Layer

In the present invention, the CrN/Cr laminate coating or the CrN/TiN laminate coating is ground, to have a composite structure of CrN and Cr or a composite structure of CrN and TiN on the outermost surface. Another reason for grinding is that an as-formed coating has particles, etc. peculiar to AIP, not suitable for a primary layer on which a thin hard amorphous carbon coating is formed. The grinding includes lapping and grinding with a grinding stone, and it is preferably plunge grinding for the purpose of forming an outer peripheral shape. The surface roughness Ra (arithmetic average surface roughness, JIS B0601 2001) is preferably adjusted to 0.01-0.05 μm.

(4) Formation of Intermediate Layer and Hard Amorphous Carbon Coating

The intermediate layer and the hard amorphous carbon coating are preferably formed in the same coating batch. For example, in an AIP apparatus comprising Cr metal cathodes 13, 14 and/or a Ti metal cathode and carbon cathodes 15, 16 as evaporation sources, only the Cr metal cathodes 13, 14 and/or the Ti metal cathode are first discharged to form an intermediate layer of Cr metal and/or Ti metal, and the carbon cathodes 15, 16 are then discharged to generate carbon ions, which are deposited on a work 18 to form a coating. Bias voltage is preferably set at −500 V to −1000 V at the start of forming a hard amorphous carbon coating, and then continuously reduced to 0 V to −200 V. To control projections such as particles, etc. within a predetermined amount, a surface of the hard amorphous carbon coating is preferably lapped. The surface roughness Ra of the coating is more preferably adjusted to 0.02-0.06 μm.

In an unbalanced magnetron sputtering (UMS) apparatus comprising Cr metal cathodes, Ti metal cathodes, metal carbide cathodes such as WC, etc. as UMS sources, the intermediate metal layer and the hydrogen-containing or metal-containing hard amorphous carbon coating can be formed in the same batch, using Ar and a hydrocarbon gas (for example, a linear hydrocarbon gas such as $CH_4$, $C_2H_2$, etc., and an aromatic hydrocarbon gas such as $C_6H_6$, etc.) as an atmosphere gas.

Example 1

A wire of SWOSC-V was formed into a piston ring having a rectangular cross section [nominal diameter (d): 96 mm, thickness (a1): 3.8 mm, and width (h1): 2.5 mm], and a barrel-faced outer peripheral surface. 50 piston rings were stacked, with outer peripheral surfaces shot-blasted to adjust their surface roughness Rzjis to 1.6 μm, and set in an AIP apparatus. For all evaporation source targets, chromium metal having purity of 99.9% was used. First, an outer peripheral surface of each piston ring base material (substrate) was cleaned by bombardment at bias voltage of −900 V, in a 99.99-%-pure Ar gas atmosphere at 1.0 Pa, and only a Cr metal layer was then formed on the base material to increase the adhesion of a primary layer to the base material.

Formation of Primary Layer

As the primary layer in Example 1, a CrN/Cr laminate coating was formed by repeating 400 cycles each comprising the formation of a CrN layer using a 99.999-%-pure $N_2$ gas at 1.5 Pa as a process gas for 36 seconds, under the conditions of arc current of 150 A on a chromium metal electrode, bias voltage of −25 V, and a table rotation speed of 3 rpm; and the formation of a Cr layer using a 99.99-%-pure Ar gas at 1.0 Pa as a process gas for 54 seconds, under the condition of arc current of 150 A on a chromium metal electrode, the bias voltage changed to −10 V, and a table rotation speed of 3 rpm. Samples were cut out of the resultant CrN/Cr laminate-coated piston rings for the following measurements.

Measurement of Primary Layer Thickness

A cross section of the piston ring sample perpendicular to its coating was mirror-polished, and observed by a scanning electron microscope (SEM) to obtain a photomicrograph, from which the thickness of the CrN/Cr laminate coating was measured. The thickness of the primary layer was 25.5 μm in Example 1. The primary layer contained metal Cr particles, though in small amounts. The thickness of a CrN/Cr laminate unit composed of a CrN layer and a Cr layer was calculated as 0.0638 μm (63.8 nm) from the above thickness of 25.5 μm and the number of lamination (400).

X-Ray Diffraction Measurement

The X-ray diffraction intensity of the mirror-polished coating surface was measured with Cu-Kα rays at tube voltage of 40 kV and tube current of 30 mA in a range of 2θ=35-70°. The measured X-ray diffraction pattern had the maximum peak intensity in a CrN (200) plane, and the diffraction peaks of a Cr (110) plane and a CrN (111) plane. In the CrN (200) plane and the Cr (110) plane, the crystallite size $D_{hkl}$ was calculated by the following Scherrer's formula:

$$D_{hkl}=K\lambda/\beta \cos \theta \tag{1},$$

wherein K is a Scherrer's constant (=0.94), λ is the wavelength of X-rays (Cu: 1.54046 Å), β is a full width at half maximum (FWHM), and θ is a Bragg's angle. In Example 1, the CrN layer had a crystallite size of 24.2 nm, and the Cr layer had a crystallite size of 21.1 nm, so that the sum of the crystallite size of the CrN layer and the crystallite size of the Cr layer was 45.3 nm. The thickness of each laminate unit calculated from the thickness was 63.8 nm, 1.4 times the sum of the crystallite sizes of CrN and Cr.

Grinding of Primary Layer

The CrN/Cr laminate coating formed as the primary layer in Example 1 was lapped, to provide the outermost surface with surface roughness Ra of 0.029 μm. It was confirmed that a composite structure of CrN and Cr was obtained by mirror-polishing the outermost surface, as shown in FIG. 3.

Formation of Intermediate Layer and Hard Amorphous Carbon Coating

The polished piston ring was cleaned and then set in a different AIP apparatus from that forming the primary layer. As evaporation sources, 99.9-%-pure chromium metal cathodes 13, 14 were used for the intermediate layer, and 99.9-%-pure carbon cathodes 15, 16 were used for the hard amorphous carbon coating. With a predetermined vacuum degree achieved in the vacuum chamber 10 by a vacuum pump (not shown) connected to a gas outlet 12, an outer peripheral surface of the piston ring, on which the primary layer was formed, was cleaned by bombardment while applying bias voltage of −900 V in a 99.99-%-pure Ar gas atmosphere at 1.0 Pa, and then provided with an intermediate Cr layer and a hard amorphous carbon coating. In Example 1, with the table rotating at 5 rpm, the intermediate Cr layer was formed using a mixture gas of Ar and $H_2$ at 1.8 Pa as a process gas at arc current of 50 A of the chromium metal cathodes 13, 14, and bias voltage of 0 V for 30 minutes, and the hard amorphous carbon coating was formed in vacuum at arc current of 80 A of the carbon cathodes 15, 16 and bias voltage of −100V (the bias voltage was set at −800 V at the start of coating, and then continuously decreased to −100 V) for 50 minutes. The hard-amorphous-carbon-coated piston ring was lapped to reduce projections such as particles, etc. on the surface within predetermined amounts, and then subjected to the following measurements and evaluation.

Thickness of Intermediate Layer

The thickness of the intermediate layer was measured by Calotest (simple film thickness measurement method). The intermediate layer in Example 1 was as thick as 0.24 μm.

Thickness of Hard Amorphous Carbon Coating

The thickness of the hard amorphous carbon coating was measured by Calotest (simple film thickness measurement method). The hard amorphous carbon coating in Example 1 was as thick as 0.8 μm.

Measurement of Hydrogen Content in Hard Amorphous Carbon Coating

The hydrogen content of the hard amorphous carbon coating was measured by hydrogen forward scattering spectrometry (HFS). The hydrogen content was 0.6 atomic % in Example 1.

Evaluation of Adhesion

The hard amorphous carbon coating was subjected to a Rockwell indentation test [indenter: a diamond cone having a tip end radius of 0.2 mm and a tip angle of 120°, indenting load: 1470 N (150 kgf)] at five points, to evaluate the adhesion of the coating from the states of the coating around the indentations, by the following standards. It may be judged that the coating has no practical problems if the evaluation is "Excellent," "Good" or "Fair."

Excellent: No defect was observed around all the indentations.

Good: A fine defect was observed at one indentation.

Fair: Fine defects were observed at two indentations.

Poor: Defects such as peeling, etc. were observed on the coating.

Example 1 was evaluated as "Excellent."

Examples 2-6

In each of Examples 2-6, a primary layer constituted by a CrN/Cr laminate coating was formed by ion plating under the deposition conditions shown in Table 1, as in Example 1. Table 1 also shows the deposition conditions of Example 1. The deposition conditions not shown in Table 1 were the same as in Example 1. The time periods of forming a CrN layer and a Cr layer were shorter in Example 2. Example 3 formed relatively porous CrN layers at a higher partial pressure of $N_2$ and smaller bias voltage than in Example 1. Examples 4, 5 and 6 formed thicker laminate units with longer time periods of forming CrN layers and Cr layers. In Example 4, the deposition time of CrN layers was longer than that of Cr layers, resulting in a smaller Cr layer ratio.

TABLE 1

| No. | $Rz_{JIS}$[1] (μm) | Arc Current (A) [2] | Process Gas Pressure | | | | Bias Voltage (V) | | Laminate Unit[3] |
|---|---|---|---|---|---|---|---|---|---|
| | | | CrN Layer | | Cr Layer | | | | |
| | | | $N_2$ (Pa) | Time (min.) | Ar (Pa) | Time (min.) | CrN Layer | Cr Layer | |
| Example 1 | 1.6 | 150 | 1.5 | 0.6 | 1.0 | 0.9 | −25 | −10 | 400 |
| Example 2 | 0.6 | 150 | 1.5 | 0.4 | 1.0 | 0.6 | −25 | −10 | 400 |
| Example 3 | 1.8 | 150 | 4.5 | 0.6 | 1.0 | 0.9 | −10 | −10 | 400 |
| Example 4 | 0.9 | 150 | 1.5 | 1.5 | 1.0 | 1.0 | −25 | −10 | 200 |
| Example 5 | 1.2 | 150 | 1.5 | 1.2 | 1.0 | 1.8 | −25 | −10 | 150 |
| Example 6 | 1.5 | 150 | 1.5 | 3 | 1.0 | 4.5 | −25 | −10 | 80 |

Note:
[1] The surface roughness of the base material.
[2] Arc current at the Cr cathode.
[3] The repeating number of laminate units.

Some piston ring samples of Examples 2-6 were selected, to measure the thickness and X-ray diffraction of each primary layer constituted by a CrN/Cr laminate coating. The results are shown in Table 2 together with those of Example 1. The primary layers were as thick as 17.6-28.8 μm, the crystallite sizes of CrN were 22.5-35.4 nm, the crystallite sizes of Cr were 19.6-28.3 nm, and the laminate units were as thick as 44.0-360.0 nm. T/S was in a range of 1.0-5.8, and the thickness of a CrN layer and the thickness of a Cr layer were close to their crystallite sizes particularly in Example 1-3. Not only CrN and Cr, but also $Cr_2N$, though in a small amount, were formed in Example 3.

TABLE 2

| No. | Primary Layer | | | Crystallite (nm) | | | $T^{(1)}$ (nm) | $T/S^{(2)}$ |
|---|---|---|---|---|---|---|---|---|
| | Thickness (μm) | Structure | | CrN | Cr | Sum (S) | | |
| | | Crystal Phase | Maximum Peak Plane | | | | | |
| Example 1 | 25.5 | CrN, Cr | CrN (200) | 24.2 | 21.1 | 45.3 | 63.8 | 1.4 |
| Example 2 | 17.6 | CrN, Cr | CrN (200) | 22.5 | 19.6 | 42.1 | 44.0 | 1.0 |

TABLE 2-continued

| | Primary Layer | | | | | | |
|---|---|---|---|---|---|---|---|
| | Thickness | Structure | | Crystallite (nm) | | | |
| No. | (μm) | Crystal Phase | Maximum Peak Plane | CrN | Cr | Sum (S) | T[1] (nm) | T/S[2] |

| No. | Thickness (μm) | Crystal Phase | Maximum Peak Plane | CrN | Cr | Sum (S) | T[1] (nm) | T/S[2] |
|---|---|---|---|---|---|---|---|---|
| Example 3 | 27.3 | CrN, Cr$_2$N, Cr | CrN (200) | 33.5 | 22.0 | 55.5 | 68.3 | 1.2 |
| Example 4 | 19.9 | CrN, Cr | CrN (200) | 26.6 | 25.5 | 52.1 | 99.5 | 1.9 |
| Example 5 | 18.6 | CrN, Cr | CrN (200) | 31.2 | 28.3 | 59.5 | 124.0 | 2.1 |
| Example 6 | 28.8 | CrN, Cr | CrN (200) | 35.4 | 26.9 | 62.3 | 360.0 | 5.8 |

Note:
[1] The thickness of each laminate unit.
[2] A ratio of the thickness T of each laminate unit to the sum of the crystallite sizes S of CrN and Cr.

The primary layers of the remaining piston rings in Examples 2-6 were lapped. Some piston rings were mirror-polished on the outermost surfaces for microstructure observation. As a result, all primary layers had composite structures of CrN and Cr. The remaining piston rings were cleaned, and then provided with intermediate layers and hard amorphous carbon coatings in the same AIP batch under the deposition conditions shown in Table 3. With basically the same arc current and bias voltage as in Example 1, the coatings with different thicknesses were formed by changing the deposition time periods. Table 3 shows the surface roughness Ra of the primary layers measured after lapping, in addition to the deposition conditions. The surface roughness Ra was in a range of 0.019-0.042 μm.

TABLE 3

| | | Intermediate Layer (Cr) | | | Hard Amorphous Carbon Coating | | | |
|---|---|---|---|---|---|---|---|---|
| | | Arc | Bias | | Arc | Bias Voltage (V) | | |
| No. | Ra (μm)[1] | Current (A) | Voltage (V) | Time (min) | Current (A) | At Start | During Forming | Time (min) |
| Example 1 | 0.029 | 50 | 0 | 30 | 80 | −800 | −100 | 50 |
| Example 2 | 0.031 | 50 | 0 | 15 | 80 | −800 | −100 | 70 |
| Example 3 | 0.042 | 50 | 0 | 45 | 80 | −800 | −100 | 45 |
| Example 4 | 0.019 | 50 | 0 | 35 | 80 | −800 | −100 | 50 |
| Example 5 | 0.025 | 50 | 0 | 30 | 80 | −800 | −100 | 75 |
| Example 6 | 0.038 | 50 | 0 | 50 | 80 | −800 | −100 | 60 |

Note:
[1] The surface roughness of the lapped primary layer.

TABLE 4

| | Intermediate | Hard Amorphous Carbon Coating | | | |
|---|---|---|---|---|---|
| No. | Layer Thickness (μm) | Thickness (μm) | Hydrogen Content (atomic %) | Surface Roughness Ra (μm) | Adhesion |
| Example 1 | 0.24 | 0.8 | 0.6 | 0.04 | Excellent |
| Example 2 | 0.11 | 1.1 | 0.4 | 0.02 | Excellent |
| Example 3 | 0.36 | 0.7 | 0.9 | 0.06 | Excellent |
| Example 4 | 0.29 | 0.8 | 1.2 | 0.07 | Excellent |
| Example 5 | 0.22 | 1.2 | 0.5 | 0.10 | Good |
| Example 6 | 0.42 | 1.0 | 0.7 | 0.13 | Fair |

After the resultant hard-amorphous-carbon-coated piston rings of Examples 2-6 were lapped to reduce projections such as particles, etc. on the coating surfaces within predetermined amounts, the thicknesses of the intermediate layers and the hard amorphous carbon coatings, and the hydrogen contents and adhesion of the hard amorphous carbon coatings were measured and elevated in the same manner as in Example 1. The results are shown in Table 4. The intermediate layers were as thick as 0.11-0.42 μm, the hard amorphous carbon coatings were as thick as 0.7-1.2 μm, the hydrogen contents were 0.4-1.2 atomic %, and the adhesion was excellent in Examples 1-4.

Examples 7 and 8

Example 7 was the same as in Example 1 except for replacing CrN layers by CrCN layers, thereby forming a primary layer constituted by a CrCN/Cr laminate coating. A process gas used for forming the CrCN layers comprised 0.87 Pa of an $N_2$ gas, 0.54 Pa of a $CH_4$ gas and 0.09 Pa of an Ar gas. In Example 8, the deposition time of a CrCN layer and the deposition time of a Cr layer were 0.9 minutes and 0.6 minutes, respectively, for a smaller Cr layer ratio, oppositely to Example 7. Also, the time periods of forming the intermediate layer and the hard amorphous carbon coating were changed to make them thinner. Table 5 shows the conditions of forming each primary layer, Table 6 shows the measured thickness and X-ray diffraction of each primary layer, Table 7 shows the conditions of forming each intermediate layer and each hard amorphous carbon coating, and Table 8 shows the measured thickness of each intermediate layer, and the measured thickness, hydrogen content and adhesion of each hard amorphous carbon coating.

In the hard-amorphous-carbon-coated piston rings of Examples 7 and 8, the outermost surface of each primary layer constituted by a CrCN/Cr laminate coating had a composite structure of CrCN and Cr as shown in FIG. 3, and the hard amorphous carbon coatings had hydrogen contents of 0.5 atomic % and 0.8 atomic %, respectively, exhibiting excellent adhesion.

TABLE 5

| No. | $Rz_{JIS}$[1] (μm) | Arc Current (A)[2] | Process Gas Pressure | | | | | | Bias Voltage (V) | |
|---|---|---|---|---|---|---|---|---|---|---|
| | | | CrCN Layer | | | | Cr Layer | | | |
| | | | $N_2$ (Pa) | $CH_4$ (Pa) | Ar (Pa) | Time (min.) | Ar (Pa) | Time (min.) | CrCN Layer | Cr Layer |
| Example 7 | 1.7 | 150 | 0.87 | 0.54 | 0.09 | 0.6 | 1.0 | 0.9 | −25 | −10 |
| Example 8 | 1.3 | 150 | 0.87 | 0.54 | 0.09 | 0.9 | 1.0 | 0.6 | −25 | −10 |

Note:
[1] The surface roughness of the base material.
[2] The arc current of the Cr cathode.

In Examples 7 and 8, the repeating number of laminate units was 400.

TABLE 6

| No. | Primary Layer | | | | | | | |
|---|---|---|---|---|---|---|---|---|
| | Thickness (μm) | Structure[1] | | Crystallite (nm) | | | | |
| | | Crystal Phase | Maximum Peak Plane | CrN | Cr | Sum (S) | T[2] (nm) | T/S[3] |
| Example 7 | 26.9 | CrN, Cr | CrN (200) | 20.0 | 18.9 | 38.9 | 67.25 | 1.7 |
| Example 8 | 23.4 | CrN, Cr | CrN (200) | 24.6 | 29.2 | 53.8 | 58.5 | 1.1 |

Note:
[1] Because the peaks of CrCN and CrN are not distinguished on an X-ray diffraction chart, they are expressed as CrN here.
[2] The thickness of each laminate unit.
[3] A ratio of the thickness T of each laminate unit to the sum of the crystallite sizes S of CrN and Cr.

TABLE 7

| No. | Ra[1] (μm) | Intermediate Layer (Cr) | | | Hard Amorphous Carbon Coating | | | |
|---|---|---|---|---|---|---|---|---|
| | | Arc Current (A) | Bias Voltage (V) | Time (min.) | Arc Current (A) | Bias Voltage (V) | | Time (min.) |
| | | | | | | At Start | During[2] | |
| Example 1 | 0.022 | 50 | 0 | 30 | 80 | −800 | −100 | 50 |
| Example 2 | 0.035 | 50 | 0 | 10 | 80 | −800 | −100 | 40 |

Note:
[1] The surface roughness of the lapped primary layer.
[2] During forming the hard amorphous carbon coating.

TABLE 8

| No. | Intermediate Layer Thickness (μm) | Hard Amorphous Carbon Coating | | | |
|---|---|---|---|---|---|
| | | Thickness (μm) | Hydrogen Content (atomic %) | Surface Roughness Ra (μm) | Adhesion |
| Example 7 | 0.25 | 0.9 | 0.5 | 0.03 | Excellent |
| Example 8 | 0.08 | 0.7 | 0.8 | 0.04 | Excellent |

Examples 9-12

In Examples 9-12, CrN/TiN laminate coatings were formed in place of the CrN/Cr laminate coatings, as primary layers. After an outer peripheral surface of each piston ring was cleaned by bombardment, a 99.999-%-pure $N_2$ gas was introduced to carry out AIP using a 99.9-%-pure chromium metal and 99.9-%-pure titanium metal as targets, under the deposition conditions of arc current at the cathodes 13, 14, bias voltage applied to works, a table rotation speed, etc., which are shown in Table 9.

TABLE 9

| No. | Rz[1] (μm) | Arc Current (A) Cr Cathode | Arc Current (A) Ti Cathode | Partial Pressure of N₂ Gas (Pa) | Bias Voltage (V) | Rotation of Table (rpm) | Deposition Time (min.) |
|---|---|---|---|---|---|---|---|
| Example 9 | 1.3 | 120 | 130 | 2.7 | −9 | 2 | 360 |
| Example 10 | 0.9 | 160 | 130 | 4 | −12 | 2 | 340 |
| Example 11 | 1.8 | 160 | 170 | 4 | −12 | 1 | 270 |
| Example 12 | 0.7 | 120 | 170 | 4 | −9 | 0.5 | 400 |

Note:
[1]The surface roughness of the base material.

Some piston ring samples of Examples 9-12 were selected to measure the thickness and X-ray diffraction of each primary layer constituted by a CrN/TiN laminate coating. The results are shown in Table 10. The primary layers were as thick as 20.9-29.8 μm, the CrN crystallite sizes were 13.3-24.3 nm, the TiN crystallite sizes were 15.2-28.5 nm, and the laminate units were as thick as 29.0-149.0 nm. T/S was in a range of 1.0-3.4, and the thickness of a CrN layer and the thickness of a TiN layer were close to their crystallite sizes particularly in Example 9-11.

TABLE 10

| | Primary layer | | | | | | | |
|---|---|---|---|---|---|---|---|---|
| | Thickness | Structure | | Crystallite Size (nm) | | | | |
| No. | (μm) | Crystal Phase | Maximum Peak Plane | CrN | TiN | Sum (S) | T[1] (nm) | T/S |
| Example 9 | 20.9 | CrN, TiN | TiN (200) | 13.3 | 15.2 | 28.5 | 29.0 | 1.0 |
| Example 10 | 27.7 | CrN, TiN | CrN (200) | 20.1 | 15.5 | 35.6 | 40.7 | 1.1 |
| Example 11 | 25.9 | CrN, TiN | CrN (200) | 24.3 | 26.5 | 50.8 | 95.9 | 1.9 |
| Example 12 | 29.8 | CrN, TiN | TiN (200) | 15.9 | 28.5 | 44.4 | 149.0 | 3.4 |

Note:
[1]The thickness of each laminate unit.

After the formed primary layers were lapped, intermediate layers and hard amorphous carbon coatings were formed in the same manner as in Example 1. Table 11 shows the conditions of forming the intermediate layers and the hard amorphous carbon coatings, and Table 12 shows the measured thickness of the intermediate layers, and the measured thickness, hydrogen content and adhesion of the hard amorphous carbon coatings. The intermediate layers were as thick as 0.18-0.33 the hard amorphous carbon coatings were as thick as 0.8-1.2 μm, the hydrogen contents were 0.7-1.2 atomic %, and the adhesion was excellent in Examples 9-11.

TABLE 11

| | | Intermediate Layer (Cr) | | | Hard Amorphous Carbon Coating | | | |
|---|---|---|---|---|---|---|---|---|
| | | Arc | Bias | | Arc | Bias Voltage (V) | | |
| No. | Ra[1] (μm) | Current (A) | Voltage (V) | Time (min.) | Current (A) | At Start | During[2] | Time (min.) |
| Example 9 | 0.037 | 50 | 0 | 25 | 80 | −800 | −100 | 60 |
| Example 10 | 0.028 | 50 | 0 | 40 | 80 | −800 | −100 | 75 |
| Example 11 | 0.044 | 50 | 0 | 30 | 80 | −800 | −100 | 70 |
| Example 12 | 0.020 | 50 | 0 | 20 | 80 | −800 | −100 | 50 |

Note:
[1]The surface roughness of the primary layer.
[2] During forming the hard amorphous carbon coating.

TABLE 12

| | Intermediate | Hard Amorphous Carbon Coating | | | | |
|---|---|---|---|---|---|---|
| | Layer Thickness | Thickness | Hydrogen Content | Surface Roughness | | |
| No. | (μm) | (μm) | (atomic %) | Ra (μm) | Adhesion |
| Example 9 | 0.21 | 1.0 | 1.2 | 0.06 | Excellent |
| Example 10 | 0.33 | 1.2 | 0.9 | 0.04 | Excellent |
| Example 11 | 0.25 | 1.1 | 1.1 | 0.05 | Excellent |

TABLE 12-continued

| | Intermediate | Hard Amorphous Carbon Coating | | | |
|---|---|---|---|---|---|
| No. | Layer Thickness (μm) | Thickness (μm) | Hydrogen Content (atomic %) | Surface Roughness Ra (μm) | Adhesion |
| Example 12 | 0.18 | 0.8 | 0.7 | 0.03 | Good |

Examples 13-16

In Examples 13-16, the remaining piston rings of Examples 9-12 were provided with intermediate layers and hard amorphous carbon coatings in the same manner as in Examples 9-12, except for forming intermediate Ti metal layers in place of the intermediate Cr metal layers. Table 13 shows the deposition conditions, and Table 14 shows the measured thickness of each intermediate layer, and the measured thickness, hydrogen content and adhesion of each hard amorphous carbon coating. The intermediate layers were as thick as 0.13-0.23 μm, the hard amorphous carbon coatings were as thick as 0.8-1.2 μm, the hydrogen contents were 0.8-1.2 atomic %, and the adhesion was excellent in Examples 13-15.

TABLE 13

| | | Intermediate Layer (Ti) | | | Hard Amorphous Carbon Coating | | | |
|---|---|---|---|---|---|---|---|---|
| | | | | | | Bias Voltage (V) | | |
| No. | Ra$^{(1)}$ (μm) | Arc Current (A) | Bias Voltage (V) | Time (min.) | Arc Current (A) | At Start | During$^{(2)}$ | Time (min.) |
| Example 13 | 0.035 | 60 | 0 | 25 | 80 | −800 | −100 | 60 |
| Example 14 | 0.029 | 60 | 0 | 40 | 80 | −800 | −100 | 75 |
| Example 15 | 0.040 | 60 | 0 | 30 | 80 | −800 | −100 | 70 |
| Example 16 | 0.023 | 60 | 0 | 20 | 80 | −800 | −100 | 50 |

$^{(1)}$The surface roughness Ra of the primary layer.
$^{(2)}$During forming the hard amorphous carbon coating.

TABLE 14

| | Intermediate | Hard Amorphous Carbon Coating | | | |
|---|---|---|---|---|---|
| No. | Layer Thickness (μm) | Thickness (μm) | Hydrogen Content (atomic %) | Surface Roughness Ra (μm) | Adhesion |
| Example 13 | 0.16 | 1.0 | 1.1 | 0.04 | Excellent |
| Example 14 | 0.23 | 1.2 | 0.8 | 0.05 | Excellent |
| Example 15 | 0.19 | 1.1 | 1.2 | 0.03 | Excellent |
| Example 16 | 0.13 | 0.8 | 0.9 | 0.04 | Good |

Examples 17 and 18

In Examples 17 and 18, the remaining piston rings of Example 1 were provided with intermediate metal layers and hard amorphous carbon coatings, using a UMS apparatus in place of the AIP apparatus. The UMS apparatus comprises four sputtering targets, and a DC pulse bias power supply as a bias power supply. In Example 17, an intermediate metal Cr layer was formed using two Cr sputtering targets in the UMS apparatus in an Ar atmosphere of 0.1 Pa, and a hydrogen-containing, hard amorphous carbon coating was then formed by CVD with a $C_2H_2$ gas [$C_2H_2/(C_2H_2+Ar)$ ratio: 30%], under the conditions of the deposition time of 4 hours, UBM coil current of 1 A, target power of 5 kW, a gas pressure ($Ar+C_2H_2$) of 0.3 Pa, bias voltage of −1000 V, a pulse frequency of 1 kHz, and a bias voltage on-off ratio of 30% in each pulse period. In Example 18, using a UMS apparatus comprising two Cr sputtering targets and two W—C sputtering targets, a tungsten-containing, hard amorphous carbon coating was formed in place of the hydrogen-containing, hard amorphous carbon coating of Example 17, under the same deposition conditions as in Example 17 except for changing the deposition time to 18 hours. Table 15 shows the measurement results of the thicknesses of the intermediate layers and the hard amorphous carbon coatings, and the hydrogen contents and adhesion of the hard amorphous carbon coatings. The intermediate layers were as thick as 0.8-0.9 μm, the hard amorphous carbon coatings were as thick as 4.3 μm in Example 17 and 16.2 μm in Example 18, and the hydrogen contents were 31.2 atomic % in Example 17 and 20.8 atomic % in Example 18. Both Examples had good surface roughness of 0.01 μm, and excellent adhesion.

TABLE 15

| | Intermediate | Hard Amorphous Carbon Coating | | | | |
|---|---|---|---|---|---|---|
| No. | Layer Thickness (μm) | Thickness (μm) | Hydrogen Content (atomic %) | W Content (atomic %) | Surface Roughness Ra (μm) | Adhesion |
| Example 17 | 0.8 | 4.3 | 31.2 | — | 0.01 | Excellent |
| Example 18 | 0.9 | 16.2 | 20.8 | 14.1 | 0.01 | Excellent |

Comparative Example 1

With the step of forming a primary layer in Example 1 omitted, the piston ring made of SWOSC-V, which was used in Example 1, was directly provided with an intermediate layer and a hard amorphous carbon coating in the same manner as in Example 1. Incidentally, the surface roughness Ra of the piston ring basematerial was adjusted to 0.03 μm. The intermediate layer had thickness of 0.26 μm, and the hard amorphous carbon coating had thickness of 0.8 μm and a hydrogen content of 0.8 atomic %, with adhesion evaluated as "Poor" because of large peeling.

Comparative Example 2

A hard-amorphous-carbon-coated piston ring was produced in the same manner as in Example 1, except for using a primary layer constituted by a single CrN layer in place of the primary layer constituted by a CrN/Cr laminate coating in Example 1. The primary layer had thickness of 23 μm, the intermediate layer had thickness of 0.25 μm, and the hard amorphous carbon coating had thickness of 0.8 μm and a hydrogen content of 0.7 atomic %, with adhesion evaluated as "Fair."

Comparative Example 3

As Comparative Example for evaluating friction loss, a piston ring having no intermediate layer and no hard amorphous carbon coating was produced, with the primary layer constituted by a single CrN layer in Comparative Example 2 formed as its outermost surface.

Evaluation of Friction Loss

Figure 5:
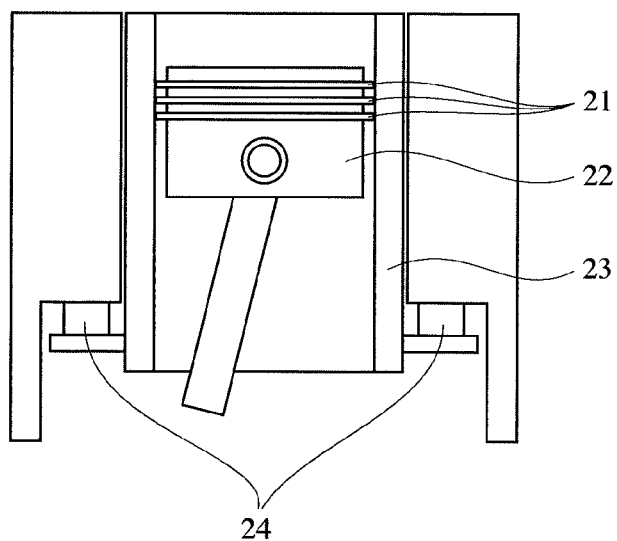
FIG. 5 is a schematic view showing the structure of a floating-liner-type, friction-measuring engine.

Each piston ring of Examples 1, 7 and 9 and Comparative Example 3 was assembled in a floating-liner-type, friction-measuring engine, to measure a friction mean effective pressure (FMEP), thereby evaluating friction loss. A cylinder liner made of cast iron as a mating member had surface roughness Ra of 0.2 μm. A second ring and an oil ring used were known rings. FIG. 5 shows the structure of the floating-liner-type, friction-measuring engine. A friction force applied to the cylinder liner when a piston ring 21 attached to a piston 22 slidably moves up and down is measured by a load-measuring sensor 24 attached to the cylinder 23. The test conditions were an engine rotation number of 1500 rpm, a load of 15 N·m, a lubricating oil temperature of 90° C., and a cooling water temperature of 100° C. Assuming that the FMEP was 100 in Comparative Example 3 having only a CrN coating, the measured FMEPs in Examples 1, 7 and 9 were 91, 89, and 93, respectively, 7-11% decrease by the hard amorphous carbon coating. Incidentally, a top ring, a second ring and an oil ring were set to have tension of 6 N, 5 N and 20 N, respectively.

Effects of the Invention

In the hard-amorphous-carbon-coated piston ring of the present invention having low friction and excellent wear resistance and peeling resistance, a hard primary layer as relatively thick as 10-60 μm suppresses the deformation of the piston ring base material, thereby avoiding the peeling of a hard amorphous carbon coating due to the deformation of the piston ring base material. Because the primary layer is formed by laminating high-hardness CrN-type chromium nitride having excellent wear resistance and metal chromium or TiN-type titanium nitride having high thermal conductivity, high heat transfer function required for a piston ring can be obtained even if the hard amorphous carbon coating having not-so-high thermal conductivity is used on the outermost surface. This heat transfer function enables heat to escape from a piston head to a cooled cylinder wall efficiently, thereby reducing thermal stress, and thus contributing to the suppression of cracking and chipping.

An intermediate layer of metal chromium and/or metal titanium having excellent adhesion to the hard amorphous carbon coating is formed between the primary layer and the hard amorphous carbon coating, with an interface of the primary layer with the intermediate layer having a composite structure of chromium nitride and metal chromium or titanium nitride, resulting in improved adhesion because of containing the same metal chromium or its nitride and/or titanium nitride as the intermediate layer. With respect to the propagation of cracks, the lamination of metal chromium having high fracture toughness and titanium nitride having high Young's modulus, with the thickness of a laminate unit in the laminate coating adjusted close to the sum of the crystallite sizes of crystals (CrN and Cr, or CrN and TiN) constituting the laminate coating, can provide a crystal layer having high crystallinity, namely high rigidity, to exhibit high resistance to the propagation of cracks. Of course, higher crystallinity results in higher thermal conductivity.

Thus, the piston ring having a CrN/Cr or CrN/TiN laminate coating as a primary layer, and covered with a hard amorphous carbon coating via an intermediate layer of a Cr metal layer and/or a Ti metal layer, has excellent wear resistance and peeling resistance, and well-balanced residual compression stress, so that even a hard amorphous carbon coating having a small hydrogen content and a high sp$^3$ bonding ratio can suppress peeling, contributing to the improvement of the fuel efficiency of automobiles by friction reduction.

What is claimed is:

1. A piston ring having a hard amorphous carbon coating at least on its outer peripheral sliding surface, the piston ring comprising:
    a base material of said piston ring comprising steel;
    a primary layer on the base material; and
    an intermediate layer on the primary layer; and
    said hard amorphous carbon coating having a thickness of 0.4-20 μm on the intermediate layer, wherein
    the intermediate layer is interposed between said primary layer and said hard amorphous carbon coating,
    said primary layer comprises a CrN/Cr or CrN/TiN laminate coating and have a thickness of 10-60 μm, which is an alternate laminate of chromium nitride mainly composed of CrN and chromium metal or titanium nitride mainly composed of TiN,
    said intermediate layer comprises chromium metal and/or titanium metal and has a thickness of 0.05-1.0 μm, and
    an interface of the primary layer with said intermediate layer has a composite structure comprising said chromium nitride and said chromium metal, or a composite structure comprising said chromium nitride and said titanium nitride.

2. The piston ring according to claim 1, wherein in said CrN/Cr laminate coating, a CrN/Cr laminate unit composed of a CrN layer and a Cr layer is as thick as 30-120 nm, in a range of 1-3 times the sum of the crystallite size of said chromium nitride and the crystallite size of said metal chromium.

3. The piston ring according to claim 1, wherein in said CrN/TiN laminate coating, a CrN/TiN laminate unit composed of a CrN layer and a TiN layer is as thick as 20-100 nm, in a range of 1-3 times the sum of the crystallite size of said chromium nitride and the crystallite size of said titanium nitride.

4. The piston ring according to claim 1, wherein carbon (C) is dissolved in said chromium nitride.

5. The piston ring according to claim 1, wherein the base material of the piston ring has a surface roughness $Rz_{JIS}$ of 0.05-3 µm, and said composite structure has a contour line pattern.

6. The piston ring according to claim 1, wherein said hard amorphous carbon coating has a hydrogen content of 5 atomic % or less.

7. A method for producing a piston ring having a hard amorphous carbon coating at least on its outer peripheral sliding surface, comprising the steps of:
adjusting the surface roughness $Rz_{JIS}$ of a base material of said piston ring comprising steel to 0.05-3 µm;
alternately laminating chromium nitride mainly composed of CrN and chromium metal or titanium nitride mainly composed of TiN to form a CrN/Cr laminate coating or a CrN/TiN laminate coating having a thickness of 15-70 µm on the base material;
grinding said CrN/Cr laminate coating or said CrN/TiN laminate coating; and
forming an intermediate metal layer on the laminate coating and the hard amorphous carbon coating having a thickness of 0.4-20 µm on the intermediate metal layer.

* * * * *